(12) United States Patent
Yoneda et al.

(10) Patent No.: US 7,855,440 B2
(45) Date of Patent: Dec. 21, 2010

(54) FUNCTIONAL DEVICE-MOUNTED MODULE AND A PROCESS FOR PRODUCING THE SAME

(75) Inventors: Yoshihiro Yoneda, Hakusan (JP); Takahiro Asada, Kanazawa (JP)

(73) Assignees: Sony Corporation, Tokyo (JP); Sony Chemical and Information Device Corporation, Tokyo (JP)

( * ) Notice: Subject to any disclaimer, the term of this patent is extended or adjusted under 35 U.S.C. 154(b) by 0 days.

(21) Appl. No.: 11/717,066

(22) Filed: Mar. 13, 2007

(65) Prior Publication Data

US 2007/0176274 A1  Aug. 2, 2007

Related U.S. Application Data

(63) Continuation-in-part of application No. PCT/JP2005/015406, filed on Aug. 25, 2005.

(30) Foreign Application Priority Data

| Sep. 14, 2004 | (JP) | ............................. 2004-267191 |
| Dec. 3, 2004 | (JP) | ............................. 2004-351371 |
| Jan. 27, 2005 | (JP) | ............................. 2005-019116 |

(51) Int. Cl.
*H01L 21/44* (2006.01)
(52) U.S. Cl. ...................... 257/678; 257/431; 257/432; 257/434; 257/E23.133; 257/E31.177; 438/64
(58) Field of Classification Search ................. 257/678, 257/780–784, E23.133, E31.117, 431, 432, 257/433, 434; 438/64
See application file for complete search history.

(56) References Cited

U.S. PATENT DOCUMENTS 5,321,204 A    6/1994    Ko 6,476,417 B2    11/2002    Honda et al.
7,176,858 B2 *    2/2007    Iwabuchi et al. .............. 345/76

(Continued)

FOREIGN PATENT DOCUMENTS

JP    A 55-128880    10/1980

(Continued)

OTHER PUBLICATIONS

Taiwan Notice of Rejection for Application No. 094129064; mailed Oct. 6, 2009 (with translation).

*Primary Examiner*—Cuong Q Nguyen
*Assistant Examiner*—Cathy N Lam
(74) *Attorney, Agent, or Firm*—Oliff & Berridge, PLC

(57) ABSTRACT

An optical functional device-mounted module and a producing process thereof. A bank to dam a liquid sealing resin is provided on a substrate around an optical functional device, the substrate being formed with a predetermined wiring pattern and having the optical functional device mounted thereon. The liquid sealing resin is filled between the functional device and the bank by dropping the liquid sealing resin therebetween. A package component member having a light transmission hole corresponding to an optical function part of the optical functional device is brought into contact with the bank such that the light transmission hole is opposed to the function part of the optical functional device, thereby causing the package component member to contact with the liquid sealing resin. The package component member is fixed onto the substrate by curing the liquid sealing resin and the bank is finally cut off and removed.

12 Claims, 9 Drawing Sheets

U.S. PATENT DOCUMENTS

2003/0205800 A1 11/2003 Kim et al.
2007/0267712 A1* 11/2007 Fujita et al. .................. 257/443

FOREIGN PATENT DOCUMENTS

| JP | A 61-032535 | 2/1986 |
| JP | A 64-032682 | 2/1989 |
| JP | A 06-061523 | 3/1994 |
| JP | A 06-342854 | 12/1994 |
| JP | A 11-121653 | 4/1999 |
| JP | A 11-261095 | 9/1999 |
| JP | A 2002-016267 | 1/2002 |
| JP | A 2002-076376 | 3/2002 |
| JP | A 2002-094082 | 3/2002 |
| JP | A 2002-222935 | 8/2002 |
| JP | A 2003-068939 | 3/2003 |
| TW | 488070 | 5/2002 |

* cited by examiner

FUNCTIONAL DEVICE-MOUNTED MODULE AND A PROCESS FOR PRODUCING THE SAME

This is a Continuation of International Application No. PCT/JP2005/015406 filed Aug. 25, 2005. The entire disclosure of the prior application is incorporated by reference herein in its entirety.

BACKGROUND OF THE INVENTION

1. Field of the Invention

The present invention relates to a functional device-mounted module such as a light receiving element and a light emitting element, for example. Particularly, the present invention relates to an optical functional device-mounted module in which an optical functional device is mounted on a substrate by using a sealing resin.

2. Discussion of the Relevant Art

Conventionally, for example, a module having a hollow structure is known in the art.

As shown in FIG. 10, a package 101 of a conventional optical functional device-mounted module 100 is constructed by installing a light transmission member 104 on a substrate 102 through a frame-shaped spacer 103. An optical function part 106 of an optical functional device 105 is opposed to the light transmission member 104 in this package 101 so as to transmit and receive optical signals 107.

However, according to the prior art, a glass provided with a special coating must be used as the light transmission member 104 so as to transmit blue-violet laser beams of a short wavelength, for example, 405 nm. Therefore, the conventional module becomes very expensive.

Further, in order to simultaneously transmit another wavelength (for example, 780 nm for CD applications and 650 nm for DVD applications), a more expensive coating needs to be applied.

Furthermore, according to conventional techniques, the frame-shaped spacer 103 is indispensable in holding the light transmission member 104. Thus, the conventional module is limited in its ability to be reduced in size.

The present disclosure solves the problems of the prior art, and provides a functional device-mounted module that needs no expensive or specialized members, can be reduced in size, and provides a process for producing the same.

SUMMARY OF THE INVENTION

The present disclosure, relates to a functional device-mounted module comprising a substrate formed with a predetermined wiring pattern, a given functional device mounted on the substrate, and a package component member having a hole corresponding to a function part of the functional device, wherein the functional device is sealed with a sealing resin such that the function part of the functional device is exposed, and the package component member is fixed onto the substrate with the sealing resin.

According to the present disclosure, the functional device can be electrically connected to the wiring pattern of the substrate by a wire-bonding method.

According to the present disclosure, a protecting cover member to cover the hole of the package component member can be provided on the package component member.

According to the present disclosure, a gas exhaust member communication with a function part-exposing space can be provided between the package component member and the protecting cover member.

According to the present disclosure, the protecting cover member can be a protecting film releasable from the package component member.

According to the present disclosure, the functional device can be an optical functional device.

According to the present disclosure, a damming portion to dam the sealing resin can be provided in the vicinity of the function part of the functional device.

According to the present disclosure, the damming portion can be provided in an area around the function part of the functional device.

According to the present disclosure, the damming portion can be formed in an almost ring-like shape.

According to the present disclosure, the damming portion can be designed as a bank formed to project above the functional device.

According to the present disclosure, the damming portion can be designed in the form of a groove formed by a protecting film formed on the functional device i.

The present disclosure also relates to a process for producing a functional device-mounted module, comprising the steps of providing a bank on a substrate in a vicinity of the functional device mounted on the substrate so as to dam up a liquid sealing resin, the substrate being formed with a predetermined wiring pattern; filling the liquid sealing resin between the functional device and the bank by dropping the sealing resin therebetween; bringing a package component member having a hole corresponding to a function part of the functional device into contact with the bank in the state that the hole is opposed to the function part of the functional device, thereby contacting the package component member with the liquid sealing resin; fixing the package component member onto the substrate by curing the liquid sealing resin; and removing the bank.

According to the process of the present disclosure, the bank can be provided in an area around the functional device.

According to the present disclosure, the bank can be formed in an almost ring-like shape.

According to the present disclosure, the functional device can be an optical functional device.

According to the present disclosure, a functional device having a damming portion provided in the vicinity of the function part and adapted to damp the sealing resin can be used as the above functional device.

According to the present disclosure, the above invention can further comprise a step of providing a protecting cover member on the package component member, the protecting cover member being adapted to cover the hole of the package component member.

Since the function part of the functional device is exposed in the functional device-mounted module according to the present disclosure, the functional device-mounted module can input and output light having a short wavelength, such as blue-violet laser beams, without using an expensive glass provided with a special coating that would causes attenuation of the light. Furthermore, the functional device mounted-module of the present disclosure has excellent heat radiation performance.

In addition, according to the present disclosure, since the frame-shaped spacer is unnecessary, a significantly downsized functional device-mounted module can be provided.

Moreover when the protecting cover member for covering the hole of the package component member is provided on the package component member, foreign matters can be prevented from attaching to the function part of the functional device.

Thus, when the gas exhaust member in communication with the function part-exposing space is provided between the package component member and the protecting cover member, a gas (air) expanded inside the function part-exposing space in reflowing can escape through the gas exhaust in order to improve the reflowing resistance. Moreover, dew condensation inside the function part-exposing space can be prevented by providing the gas exhaust.

Furthermore, by using a protecting film, that is releasable from the package component member as the protecting cover member, optical signals can be input and output without being attenuated by releasing the protecting film, for example.

According to the present disclosure, the above-mentioned functional device-mounted module can be produced by extremely simple steps.

For example, when a bank is provided in the area around the functional device or a bank is formed in the almost ring-like shape, the liquid sealing resin can be dammed around the functional device so that the functional device can be sealed.

Alternatively, when the damming portion is provided in the vicinity of the function part of the functional device, the sealing resin can be certainly dammed in the vicinity of the function part. Thus, the quality of the product can be improved, and the yield can be increased.

Thus, when the damming portion is provided in the area around the function part of the functional device or the bank is formed in the almost ring-like shape, the liquid sealing resin can be dammed around the function part, while the functional device can be sealed excluding the function part.

Furthermore, when the bank formed to project above the functional device is employed as the damming portion, the invention can be applied to a module, such as a light receiving element in which light is not desired to be shield with the damming material above the function part.

In addition, when the damming portion is the groove formed by the protecting film provided on the functional device, the projecting film can protect the function part and prevent the attachment of foreign matters.

According to the present disclosure, without using an expensive glass having a special coating, light having a short wavelength such as a blue-violet laser beams, can be input and output without attenuating the light. Moreover, the present disclosure can provide the functional device-mounted module which has excellent heat dissipation properties and can be largely downsized.

DETAILED DESCRIPTION OF THE INVENTION

In the following, preferred embodiments of the present disclosure will be explained in detail with reference to the drawings.

FIGS. 1(a) to (d) are sectional construction views showing an exemplary embodiment of the process for producing the optical functional device-mounted module according to the present disclosure. FIG. 2 is a sectional construction view showing an embodiment of the same optical functional device-mounted module.

Figure 1:
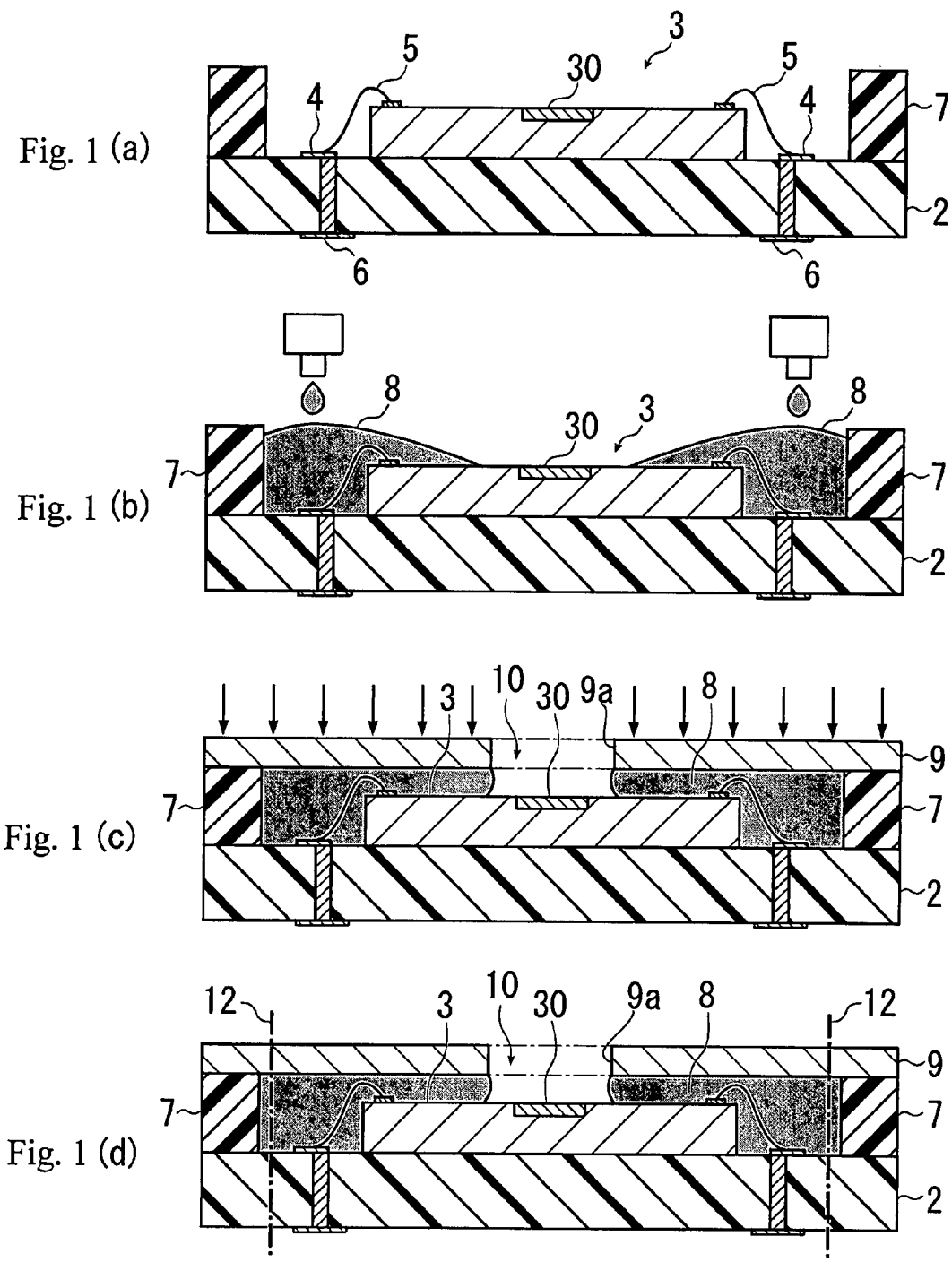
FIGS. 1(a) to (d) are sectional views showing an embodiment of the process for producing an optical functional device-mounted module according to the present disclosure.
Figure 2:
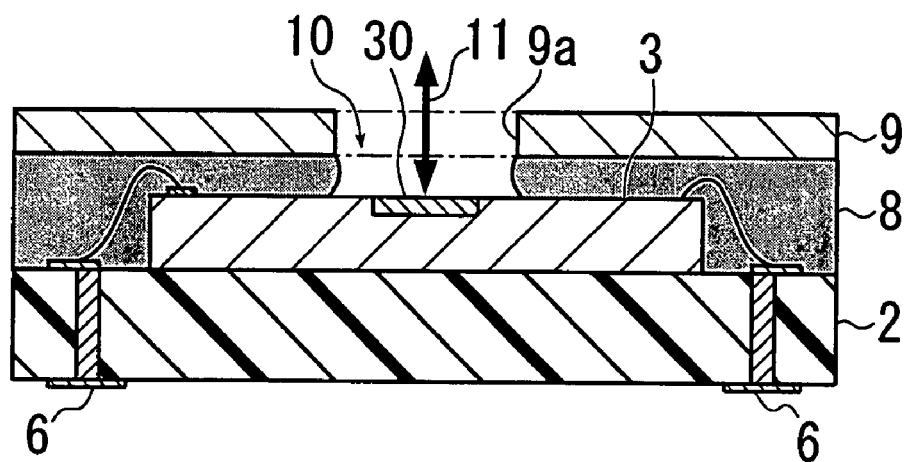
FIG. 2 is a sectional construction view of the embodiment of the optical functional device-mounted module according to the present disclosure.

As shown in FIG. 1(a), according to this embodiment, an optical functional device 3 having an optical function part (function part) 30, such as a light receiving element or a light emitting element is first mounted on a substrate having a prescribed wiring pattern 4.

In this embodiment, contact portions of the wiring pattern 4 on the substrate 2 are electrically connected to those of the optical functional device 3 by gold wires 5, and current flows through external connecting terminals 6 at a back side of the substrate 2.

A bank 7 to dam the liquid sealing resin is provided in an area around the optical functional device on the substrate 2 (for example, an edge portion of the substrate 2).

Although the shape of the bank 7 is not particularly limited, the damming portion is preferably formed in a ring-like shape (for example, a rectangular shape) from the standpoint of certainly damming the sealing resin.

The height of the bank 7 is preferably set to satisfy the condition that an upper end portion of the damming portion is higher than that of the gold wires 5 upon pressing the below-mentioned package component member 9.

Next, as shown in FIG. 1(b), the liquid sealing resin 8 is dropped between the optical functional device 3 and the bank 7, thereby filling this sealing resin 8 between the optical functional device and the bank 7.

In this embodiment, the bank 7 is preferably formed in such a shape that the sealing resin 8 does not reach the optical function part 30 of the optical functional device 3 and the top portion of the sealing resin 8 is at almost the same level as that of the upper end of the bank 7.

In the present disclosure, sealing resin 8 is not limited to any particular kind of resin, but an epoxy-based resin is preferably used from the standpoint of ensuring the quality in sealing.

Further, as shown in FIG. 1(c), the package component member 9 is arranged on and in contact with the bank 7, and is wholly pressed toward the substrate 2 under given pressure.

The package component member 9 is a planar member such as a printed wiring board or a plastic board, and a central portion of the package component member 9 is provided with a light transmission hole (hole) 9a corresponding to the optical function part 30 of the optical functional device 3. The package component member is pressed such that the light transmission hole 9a is arranged immediately above the optical function part 30.

A face (e.g. lower face) of the package component member 9 toward the substrate 2 is brought into contact with the sealing resin 8 by this step, so that the sealing resin 8 is filled to cover the optical functional device 3, excluding the optical function part 30.

That is, the sealing resin 8 filled between the optical functional device 3 and the bank 7 spreads toward the light transmission hole 9a along the lower face of the package component member 9 owing to the capillary action, but the sealing resin 8 is dammed by an edge portion of the light transmission hole 9a in a fine gap (clearance) between the lower face of the package component member 9 and the optical functional device 3 owing to the surface tension of the sealing resin 8. Thus, the sealing resin 8 stays without invading the optical function part 30.

In the present disclosure, the size of the light transmission hole 9a of the package component member 9 is not particularly limited, but the size of the light transmission hole 9a is preferably set such that the distance between the optical function part 30 and the hole 9a around the optical function part 30 of the optical functional device 3 is 100 to 800 μm and preferably 500 to 700 μm, in view of a case in which the sealing resin 8 flows into the light transmission space 10.

A clearance between an upper face of the optical functional device 3 and the lower face of the package component member 9 is preferably set at 100 to 600 μm for similar reasons.

Further, when a thermosetting type resin is used as the sealing resin 8, for example, the sealing resin 8 is cured by heating the resin at a preset temperature, and the package component member 9 is fixed onto the substrate 2.

Then, as shown in FIG. 1(d), dicing is performed along scribing lines 12 positioned inside and near the bank 7, thereby obtaining a target optical functional device-mounted module 1 as shown in FIG. 2.

As mentioned above, since the optical function part 30 of the optical functional device 3 is exposed in the optical functional device-mounted module 1 of this embodiment, it is possible to provide the optical functional device-mounted module 1 which can surely input and output the light 11 having a short wavelength such as blue-violet laser beams without using an expensive glass having a special coating and without attenuating the light. The obtained optical functional device-mounted module has excellent heat radiation performance.

In addition, according to this embodiment, since the frame-shaped spacer is unnecessary, the largely downsized optical functional device-mounted module 1 can be provided.

Additionally, according to an embodiment of the process, the above-mentioned optical functional device-mounted module 1 can be produced by extremely simple steps.

Particularly, since the bank 7 having the ring-like shape is formed in the area around the optical functional device 3 in this embodiment, the liquid sealing resin 8 can be certainly dammed around the optical functional device 3 and the optical functional device 3 can be sealed to exclude the optical function part 30.

FIGS. 3(a) to (d) are sectional construction views showing a principal portion of another embodiment of the present disclosure. In the following, the same reference numbers are given to portions corresponding to those in the above embodiment, and explanation thereon is omitted.

In this embodiment, a functional device 3A having a predetermined function part 30A is mounted on a substrate 2 formed with a predetermined wiring pattern 4, and a liquid sealing resin 8 is filled between the functional device 3A and the bank 7 by dropping the sealing resin 8 therebetween.

Figure 3A:
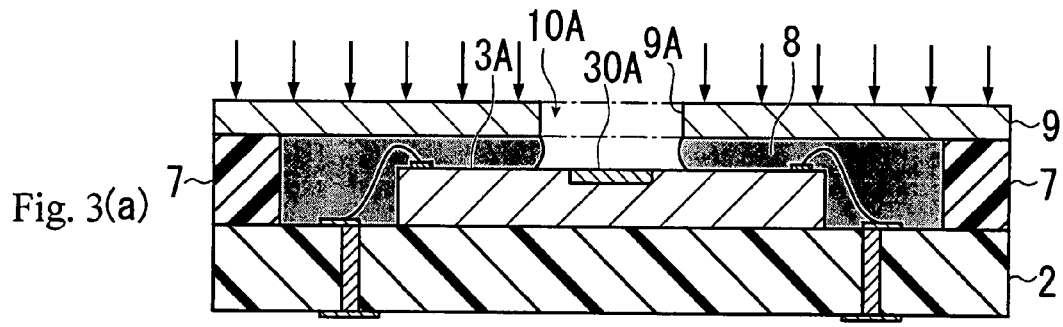
FIGS. 3(a) to (d) are sectional construction views showing a principal portion of another embodiment of the present disclosure.

Then, as shown in FIG. 3(a), a package component member 9 is arranged on and in contact with the bank 7, and the package component member 9 is wholly pressed toward the substrate 2 under given pressure.

Figure 3B:
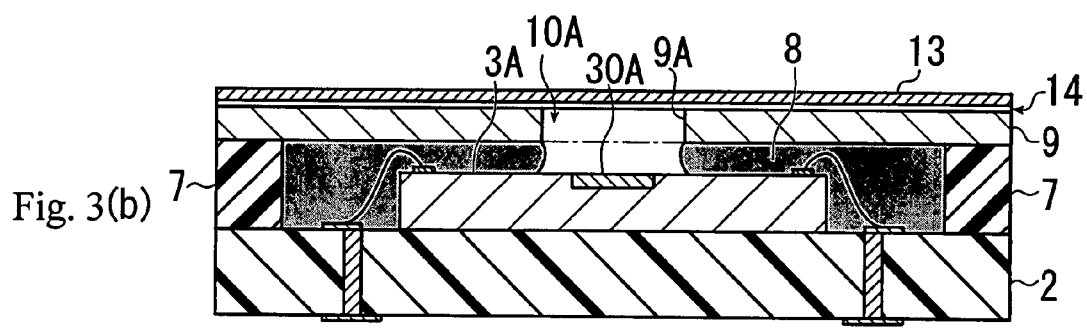

Further, as shown in FIG. 3(b), for instance, a planar protecting cover member 13 is bonded onto the package component member 9 by using an adhesive so as to cover the function part-exposing hole 9A. Thus, the function part-exposing space 10A is formed above the function part 30A of the functional device 3A.

In embodiment, a glass substrate or a resin substrate can be used as the protecting cover member 13. When the functional device 3A is an optical functional device such as a light receiving element or a light emitting element, it is better to use a light transmission glass substrate, for example.

In other embodiments, a groove is formed on the protecting cover member 13 at the position where the package component member 9 is opposed. This construction provides a gas exhaust member 14 in communication with the function part-exposing space 10A between the package component member 9 and the protecting cover member 13.

Figure 3C:
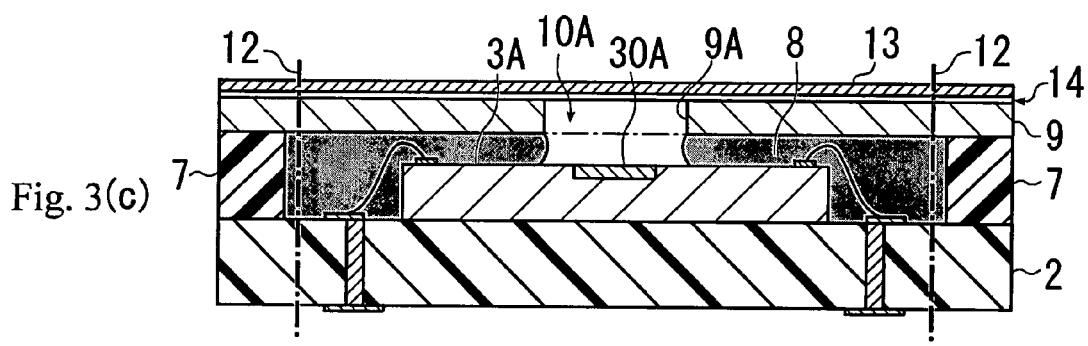
Figure 3D:
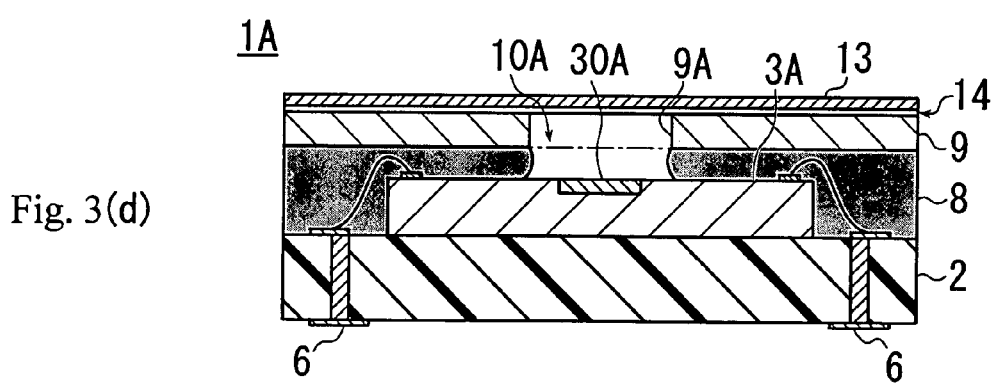

Thereafter, as shown in FIGS. 3(c) and (d), dicing is performed along scribing lines 12 positioned inside and near the bank 7, thereby obtaining a target functional device-mounted module 1A. In embodiments, the above package component member 9 can be pressed after the protecting cover member 13 is adhered thereto.

As mentioned above, according to this embodiment, in addition to the effects similar to those in the above embodiment, attachment of foreign matters onto the function part 30A of the functional device 3A can be prevented, since the protecting cover member 13 is provided on the package component member 9 to cover the function part-exposing hole 9A.

Further, in embodiments, since the gas exhaust member 14 in communication with the function part-exposing space 10A is provided between the package component member 9 and the protecting cover member 13, the gas (air) expanded in the function part-exposing space 10A on reflowing can escape through the gas exhaust member 14 to improve the reflow resistance. Further, the dew condensation inside the function part-exposing space 10A can be prevented by providing this gas exhaust member 14.

Since the other constructions, functions and effects are the same as those in the above-mentioned embodiments, a detailed explanation thereof is omitted.

FIGS. 4(a) to (d) are sectional construction views of a principal portion of another embodiment of the present invention. Portions corresponding to those in the above-mentioned embodiments are provided with the same reference numbers, and a detailed explanation thereof is omitted.

In embodiments, a functional device 3A having a predetermined function part 30A is first mounted on a substrate 2 formed with a predetermined wiring pattern 4, and a liquid sealing resin 8 is filled between the functional device 3A and the bank 7 by dropping the sealing resin 8 therebetween.

Figure 4:
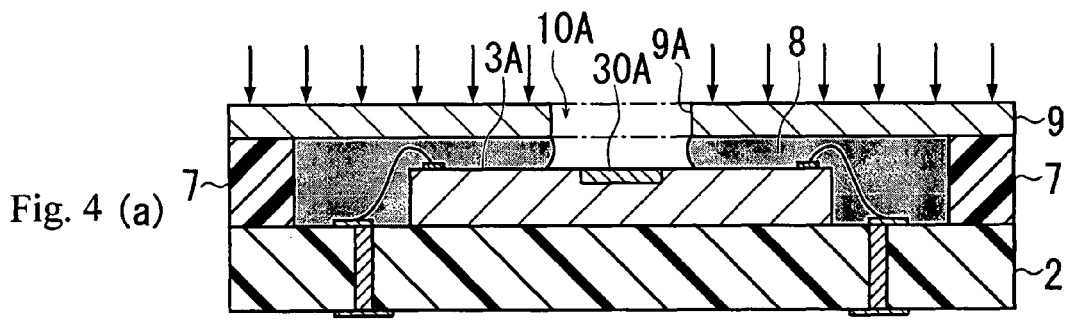
FIGS. 4(a) to (d) are sectional construction views showing a principal portion of still another embodiment of the present disclosure.
Figure 4:
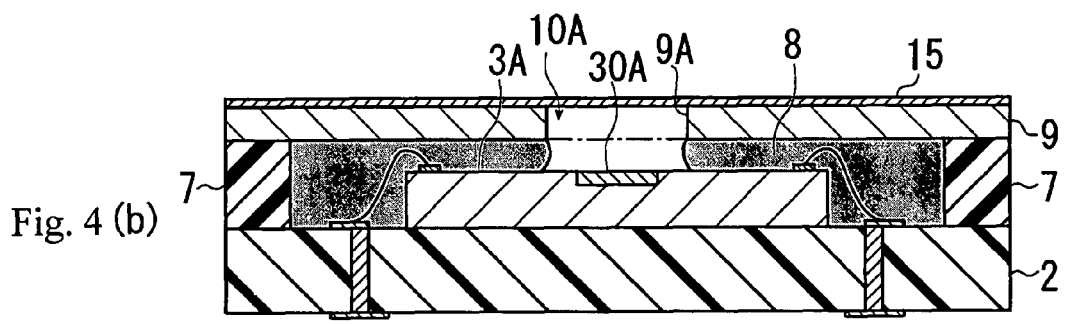
Figure 4:
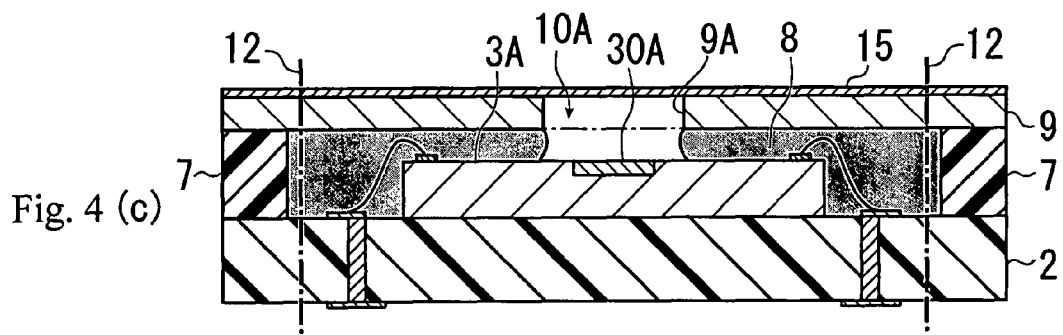
Figure 4:
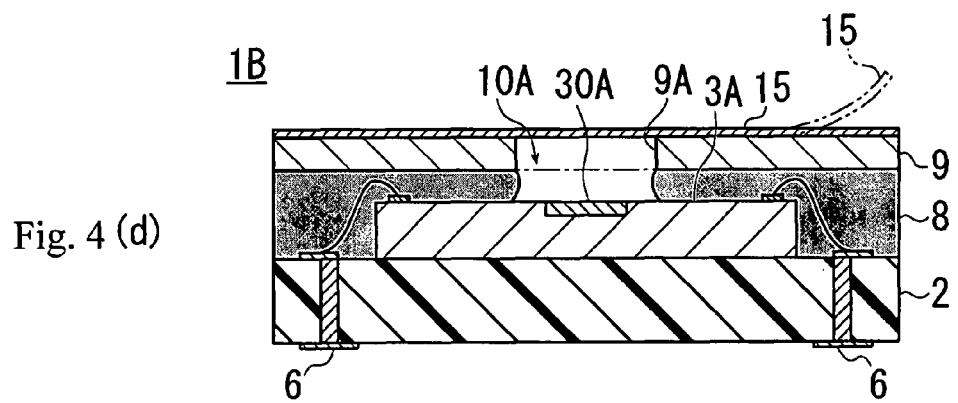

Then, as shown in FIG. 4(a), a package component member 9 is arranged on and in contact with the bank 7, and the package component member 9 is pressed toward the substrate 2 under given pressure.

Further, as shown in FIG. 4(b), a protecting film 15 made of a resin material, for example, is adhered onto the package component member 9 by an adhesive, so as to cover the function part-exposing hole 9A. By the above step, the function part-exposing space 10A is formed above the function part 30A of the functional device 3A.

In embodiments, the adhesive used for adhering the protecting film 15, may have a weak adhesive force and thus enable the protecting film 15 to be released from the package component member 9.

Thereafter, as shown in FIG. 4(d), dicing is performed along scribing lines 12 positioned inside and near the bank 7, thereby obtaining a target functional device-mounted module 1B.

In embodiments, attachment of foreign matters onto the function part 30A of the functional device 3A can be prevented, since the protecting film 15 is provided on the package component member 9 to cover the function part-exposing hole 9A.

Moreover, protecting film 15, which is releasable from the package component member 9, may be used in embodiments. Therefore, optical signals can be input and output without attenuation by releasing protecting film 15, when an optical functional device is used (see FIG. 4(d)).

FIGS. 5(a) to (d) are sectional construction views of still another embodiment of the process for producing the functional device-mounted module according to the present disclosure.

Figure 6:
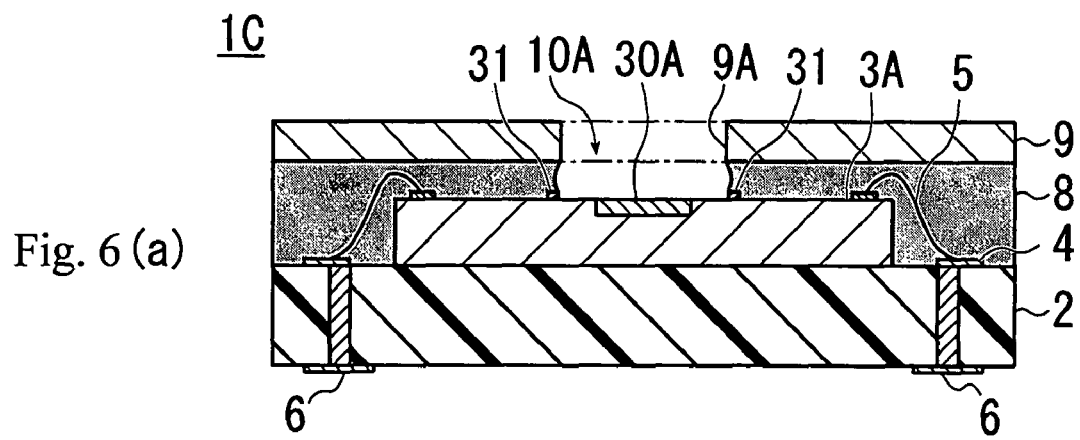
FIGS. 6(a) and (b) are a sectional construction view of the same functional device-mounted module and a plan view showing an outer construction of the same functional device-mounted module before sealing, respectively.
Figure 6:
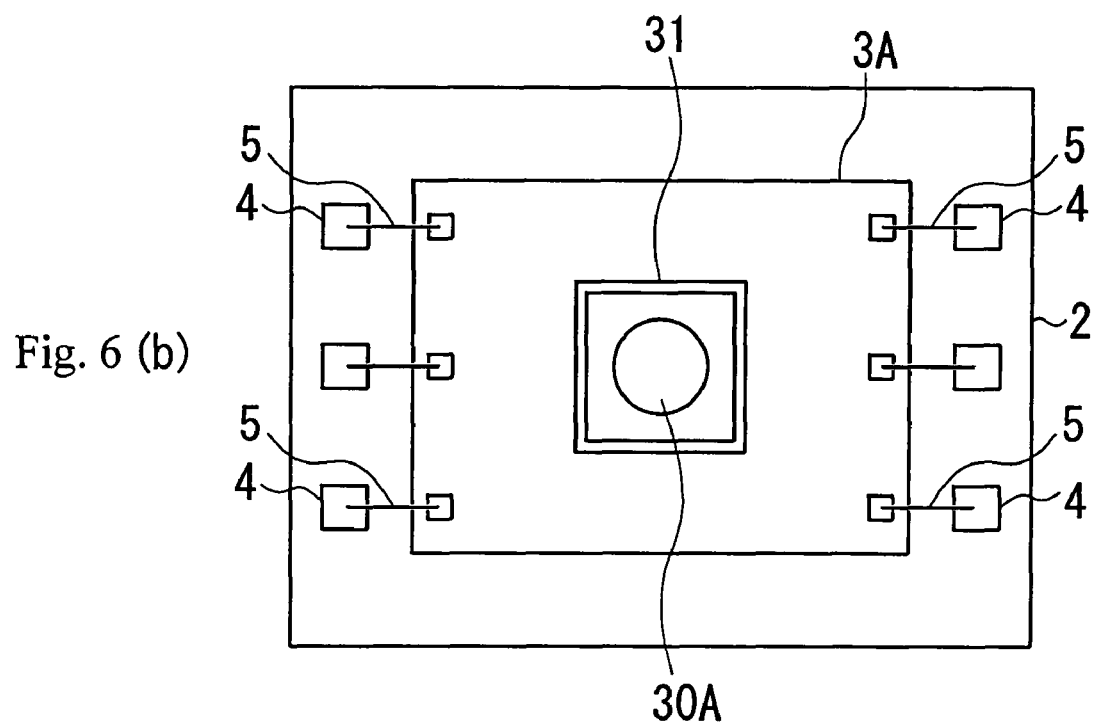

Further, FIG. 6(a) is a sectional construction view of the same functional device-mounted module, and FIG. 6(b) is a plan view of the outer construction of this functional device-mounted module before sealing.

In the following, portions corresponding to those of the above-mentioned embodiments are provided with the same reference numbers, and detailed explanation thereof is omitted.

As shown in FIG. 5(a) and FIGS. 6(a) and (b), as a given functional device 3A in this embodiment is used a functional device provided with a damming portion 31 near the function part 30A to dam the sealing resin 8.

In the present disclosure, the process for producing the damming portion 31 is not particularly limited, but it is preferably formed according to a publicly known photolithography method by using a material (e.g., polyimide) for forming a protecting film (passivation), as in existing general-purpose process for the semiconductors.

In the present disclosure, the size or the shape of the damming portion 31 is not particularly limited. However, considering a case where the sealing resin 8 flows into the function part-exposing space 10A, it is preferable to form the damming portion 31 to correspond to a shape of the function part-exposing hole 9A of the package component member 9. For example, it is preferable to form the damming portion 31 to be a rectangular ring-like shape in size almost identical to the function part-exposing hole 9A.

Specifically, it is preferable to set the size of the damming portion 31 such that the distance between the function part 30A and the dam portion around the function part 30A of the functional device 3A is 100 to 800 μm and preferably 500 to 700 μm.

Further, from the same standpoint, it is preferable that the width and the height of the damming portion 31 are set to 50 to 300 μm for the width and 1 to 50 μm for the height, respectively and that the clearance between the upper portion of the damming portion 31 and the lower face of the package component member 9 is set at 100 to 500 μm.

In embodiments, as shown in FIGS. 5(a) and (b), the functional device 3A as mentioned above is mounted on the substrate 2 formed with the predetermined wiring pattern 4, and the liquid sealing resin 8 is filled between the functional device 3A and the bank 7 by dropping the sealing resin 8 therebetween.

Then, as shown in FIG. 5(c), the package component member 9 is arranged on and in contact with the bank 7, and is pressed toward the substrate 2 under a given pressure.

Then, the sealing resin 8 spreads toward the function part-exposing hole 9a along the lower face of the package component member 9 owing to the capillary action, but the sealing resin 8 is dammed by the edge portion of the function part-exposing hole 9A and a step portion of the damming portion 31 on the functional device 3A. Consequently, the sealing resin 8 stays in place without invading the function part 30A.

For instance, when a thermosetting type resin is used as the sealing resin 8, the sealing resin 8 is cured by heating at a given temperature at this stage, thereby fixing the package component member 9 onto the substrate 2.

Thereafter, as shown in FIG. 5(d), dicing is performed along scribing lines 12 positioned inside and near the bank 7. Thereby a target functional device-mounted module 1C as shown in FIG. 6(a) is obtained.

As mentioned above, according to embodiments, since the damming portion 31 is provided near the function part 30A of the functional device 3A, the sealing resin 8 can be dammed near the function part 30A, so that the quality and the yield of the product can be improved.

Figure 7:
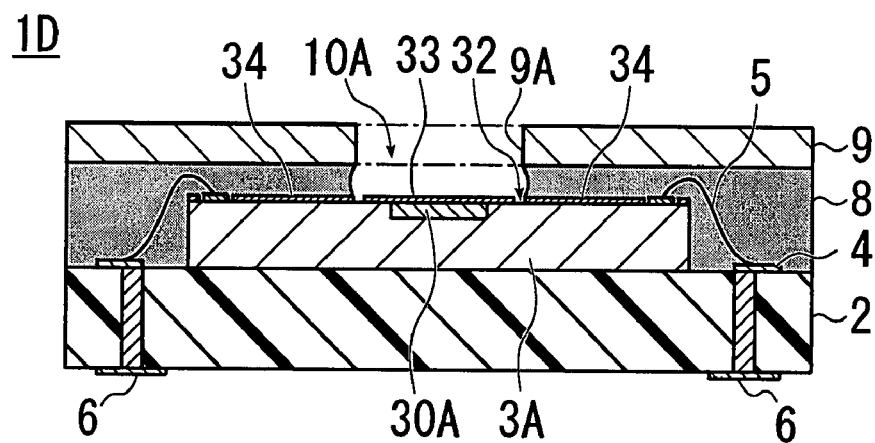
FIGS. 7(a) and (b) are a sectional construction view showing still another embodiment of the functional device-mounted module according to the present disclosure and a plan view showing an outer construction of the same functional device-mounted module before sealing, respectively.
Figure 7:
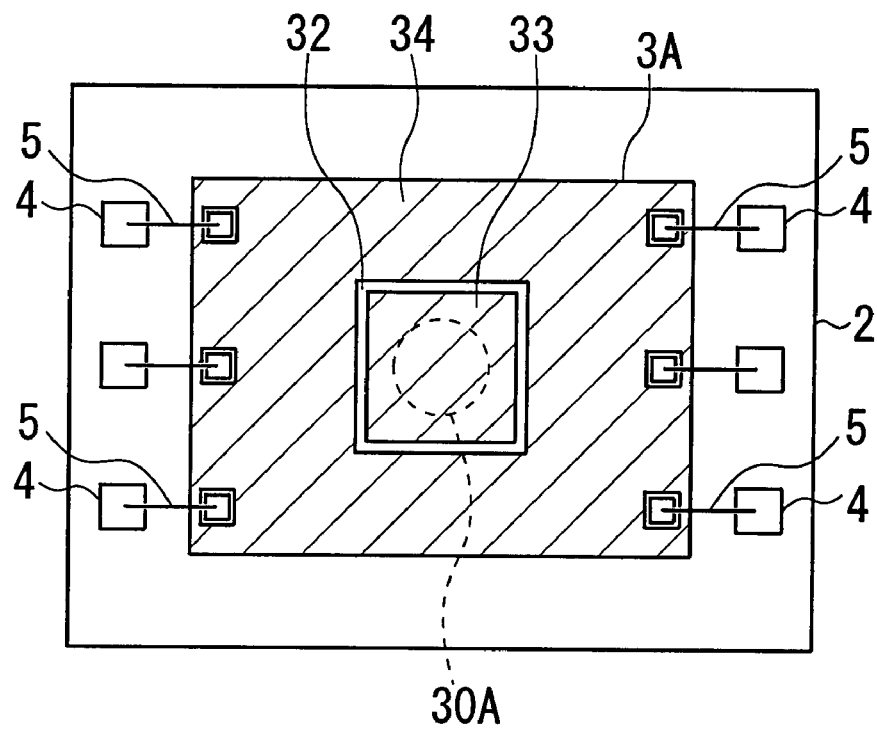

FIG. 7(a) is a sectional construction view showing still another embodiment of the functional device-mounted module according to the present disclosure, and FIG. 7(b) is a plan view showing the outer construction of the same functional device-mounted module before sealing. In the following, portions corresponding to those of the above-mentioned embodiments are provided with the same reference numbers, and detailed explanation thereof is omitted.

As shown in FIGS. 7(a) and (b), in the functional device-mounted module 1D of this embodiment, a functional device of which a groove (damming portion) 32 for damming the sealing resin 8 is provided near a function part 30A is used as a given functional device 3A.

In the present disclosure, the process for producing the groove 32 is not particularly limited. However, in existing general-purpose process relating to the semiconductors, the groove is preferably formed by providing protecting films (passivation) on the function part 30A of the functional device 3A and its surrounding area, respectively, according to publicly known photolithography process.

In the present disclosure, the size or the shape of the groove 32 are not particularly limited. However, considering a case where the sealing resin 8 flows into the function part-exposing space 10A, it is preferable to form the groove 32, for example, in a rectangular ring-like shape and a size almost identical with those of the function part-exposing hole 9A so as to correspond to the shape of the function part-exposing hole 9A of the package component member 9.

Specifically, it is preferable to set the size of the groove 32 such that the distance between the function part 30A and the groove 32 around the function part 30A of the functional device 3A is 100 to 800 μm, a preferably 500 to 700 μm.

Further, from a similar standpoint, it is preferable that the width and the depth of the groove 32 are set to be 50 to 300 μm for the width and 1 to 50 μm for the depth, respectively and that the clearance between the upper portion of the protecting film and the lower face of the package component member 9 is set to 100 to 500 μm.

Figure 5:
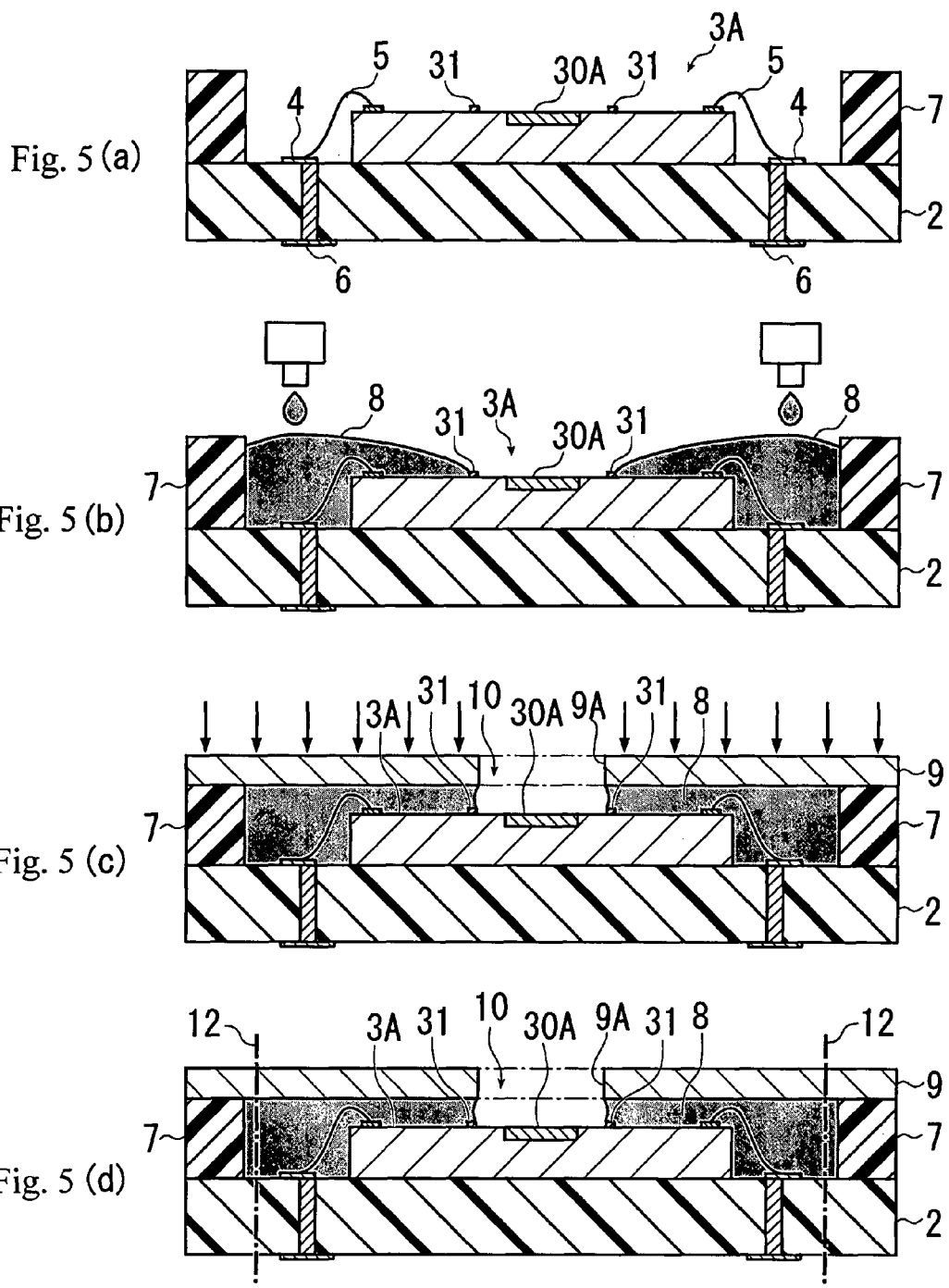
FIGS. 5(a) to (d) are sectional construction views showing still another embodiment of the process for producing the functional device-mounted module according to the present invention.

The functional device-mounted module 1D of this embodiment can also be produced by the same process as in the embodiment shown in FIG. 5, for example.

As mentioned above, in embodiments, since the groove 32 is provided near the function part 30A of the functional device 3A, the sealing resin 8 can be dammed near the function part 30A, so that the quality and the yield of the product can be improved.

Figure 8:
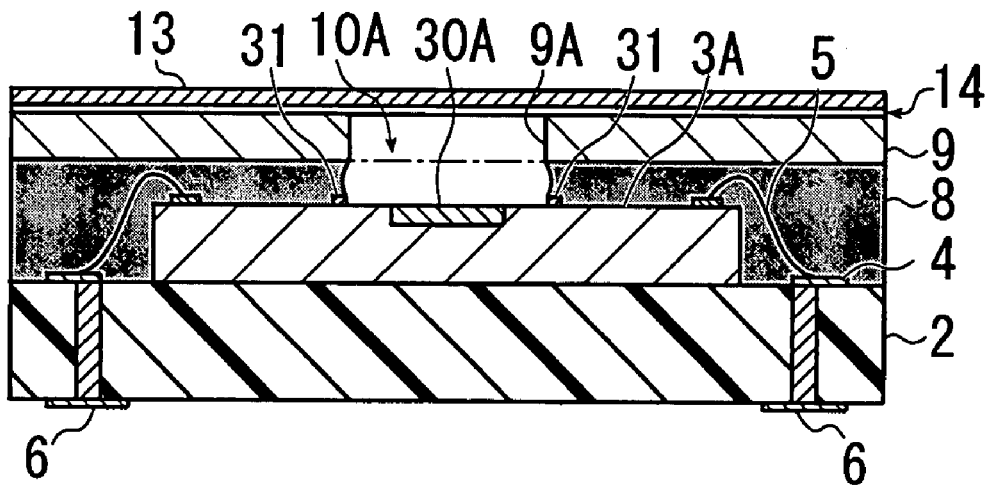
FIGS. 8 (a) and (b) are sectional construction views of an outer construction of still another embodiment of the functional device-mounted module according to the present disclosure.
Figure 8:
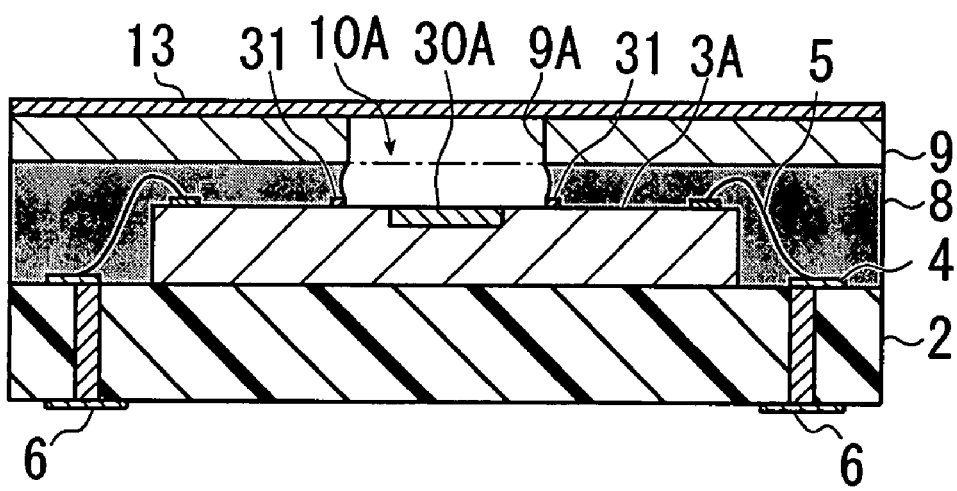
Figure 9:
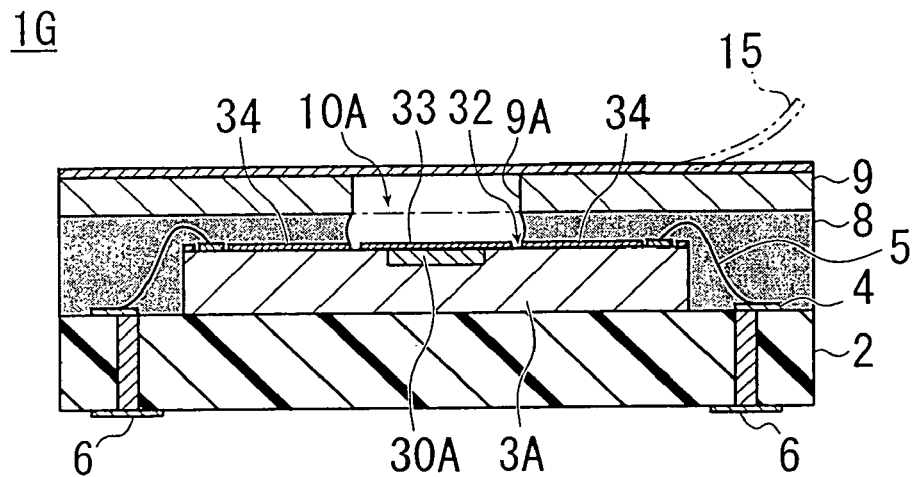
FIG. 9 is a sectional construction view showing still another embodiment of the functional device-mounted module according to the present disclosure.
Figure 10:
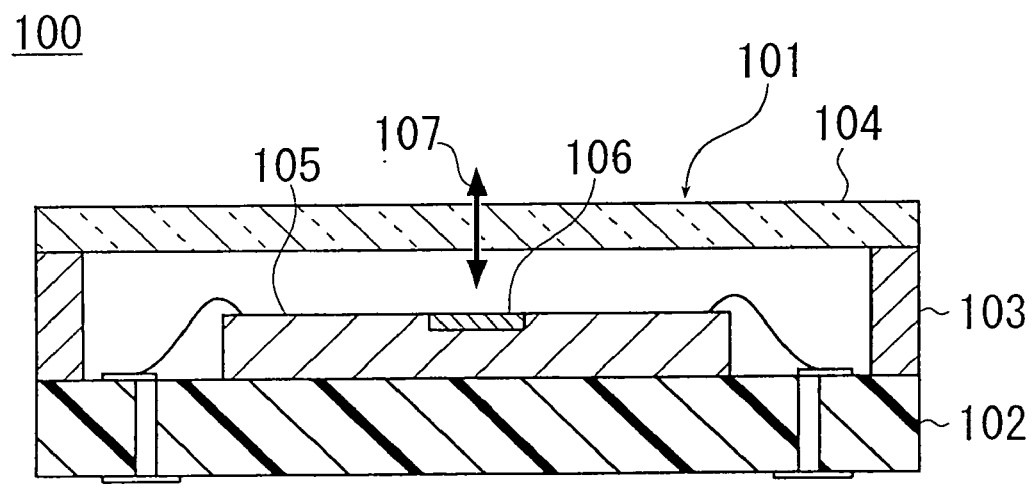
FIG. 10 is a sectional construction view of the conventional optical functional device-mounted module.

FIGS. 8(a), 8(b) and FIG. 9 are sectional construction views showing still another embodiment of the functional device-mounted module according to the present disclosure. In the following, parts corresponding to those in the above-mentioned embodiments are provided with the same reference numbers, and detailed explanation thereof is omitted.

In the functional device-mounted module 1E shown in FIG. 8(a), the above-mentioned protecting cover member 13 is provided on the package component member 9 of the above-mentioned functional device-mounted module 1C.

In the functional device-mounted module 1F shown in FIG. 8(b), the above-mentioned protecting cover member 13 having no gas exhaust member 14 is provided on the package component member 9 of the above-mentioned functional device-mounted module 1C.

In these cases, the protecting cover member 13 can be provided by the same method as in the above-mentioned embodiments.

According to embodiments having such a construction, since the protecting cover member 13 is provided on the package component member 9 to cover the function part-exposing hole 9A, attachment of foreign matters onto the function part 30A of the functional device 3A can be prevented. Since other construction, functions and effects are the same as in the above-mentioned embodiments, detailed explanation thereof is omitted.

Although, in the functional device-mounted module 1G shown in FIG. 9, the above-mentioned releasable protecting film 15 may be provided on the package component member 9 of the above-mentioned functional device-mounted module 1D.

In this case, the protecting film 15 can be provided by the same method as in the above-mentioned embodiments.

According to embodiments having such a construction, the function part 3A is covered with the protecting film 33 so that attachment of foreign matters onto the function part 30A of the functional device 3A can be prevented, even when the protecting film is released on use. Since other construction, functions and effects are the same as in the above-mentioned embodiments, detailed explanation thereof is omitted.

The present disclosure is not limited to the above-mentioned embodiments, but various changes can be made.

For instance, the bank may be formed in the ring-like shape in the above-mentioned embodiments, but it can be formed in a different shape, so long as it can effectively dam the liquid sealing resin.

In embodiments, it is possible that an electron beam (e.g., ultraviolet rays) curable resin is used as the sealing resin, and is cured with the electron beam. In this case, the package component member 9 is comprised of a light transmission material, and the electron beam is irradiated through the package component member 9.

Further, the present invention can be applied not only to the optical functional device-mounted module, but also to parts for various MEMS (Micro Electro Mechanical System).

Further, according to the present invention, any combinations of the above-mentioned embodiments can be constructed.

What is claimed is:

1. A functional device-mounted module comprising:
a substrate formed with a predetermined wiring pattern;
a given functional device mounted on the substrate, the functional device having a function part; and
a planar board for composing a package fixed on the substrate by a cured sealing resin, the planar board having a hole formed therethrough, the hole of the planar board being placed opposite to the function part of the functional device,
wherein
the cured sealing resin is dammed by an edge portion of the hole of the planar board so that the function part of the functional device is exposed, and filled to cover the functional device excluding the exposed function part of the functional device.

2. The functional device-mounted module according to claim 1, wherein the functional device is electrically connected to the wiring pattern of the substrate by a wire-bonding method.

3. The functional device-mounted module according to claim 1, wherein the functional device is an optical functional device.

4. The functional device-mounted module according to claim 1, wherein a damming portion to dam the sealing resin is provided in the vicinity of the function part of the functional device.

5. The functional device-mounted module according to claim 4, wherein the damming portion is provided in an area around the function part of the functional device.

6. The functional device-mounted module set forth in claim 5, wherein the damming portion is formed in an almost ring-like shape.

7. The functional device-mounted module according to claim 4, wherein the damming portion is a bank formed to project above the functional device.

8. The functional device-mounted module according to claim 4, wherein the damming portion is a groove formed by a protecting film provided on the functional device.

9. A functional device-mounted module comprising:
a substrate formed with a predetermined wiring pattern;
a given functional device having a function part and mounted on the substrate;
a planar board for composing a package fixed onto the substrate by a cured sealing resin, the planar board having a hole formed therethrough, the hole of the planar board being placed opposite to the function part of the functional device;
and a protecting member for covering the hole of the planar board;
wherein the cured sealing resin is dammed by an edge portion of the hole so that the function part of the functional device is exposed and filled to cover the functional device excluding the exposed function part of the functional device.

10. A functional device-mounted module comprising:
a substrate formed with a predetermined wiring pattern;
a given functional device having a function part and mounted on the substrate;
a planar board for composing a package fixed onto the substrate by a cured sealing resin, the planar board having a hole formed therethrough, the hole of the planar board being placed opposite to the function part of the functional device; and
a protecting member for covering the hole of the planar board, the protecting member being releasable from the planar board;
wherein the cured sealing resin is dammed by an edge portion of the hole of the planar board so that the function part of the functional device is exposed, and filled to cover the functional device excluding the exposed function part of the functional device.

11. A functional device-mounted module comprising:

a substrate formed with a predetermined wiring pattern;

a given functional device having a function part and mounted on the substrate;

a planar board for composing a package fixed onto the substrate by a cured sealing resin, the planar board having a hole formed therethrough, the hole of the planar board being placed opposite to the function part of the functional device;

a protecting member for covering the hole of the planar board; and a gas exhaust communicating with a function part-exposing space provided between the planar board and the protecting member, wherein the cured sealing resin is dammed by an edge portion of the hole of the planar board so that the function part of the functional device is exposed, and filled to cover the functional device excluding the exposed function part of the functional device.

12. An optical functional device-mounted module comprising:

a substrate formed with a predetermined wiring pattern;

an optical functional device having an optical function part and mounted on the substrate;

a planar board for composing a package fixed onto the substrate by a cured sealing resin, the planar board having a hole formed therethrough, the hole of the planar board being placed opposite to the optical function part of the optical functional device; and a protecting member for covering the hole of the planar board, the protecting member being releasable from the planar board;

wherein the cured sealing resin is dammed by an edge portion of the hole of the planar board so that the function part of the functional device is exposed, and filled to cover the functional device excluding the exposed function part of the functional device.

* * * * *